(12) United States Patent
Harada et al.

(10) Patent No.: US 6,236,084 B1
(45) Date of Patent: May 22, 2001

(54) SEMICONDUCTOR INTEGRATED CIRCUIT DEVICE HAVING DOUBLE DIFFUSION INSULATED GATE FIELD EFFECT TRANSISTOR

(75) Inventors: Hirofumi Harada; Jun Osanai, both of Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/320,111

(22) Filed: May 26, 1999

(51) Int. Cl.[7] .............................. H01L 29/76; H01L 29/94
(52) U.S. Cl. ........................ 257/338; 257/339; 257/342; 257/343
(58) Field of Search ................................. 257/338, 343, 257/342, 339, 335

(56) References Cited

U.S. PATENT DOCUMENTS

| | | | |
|---|---|---|---|
| 4,712,124 | * 12/1987 | Stupp | 357/23.4 |
| 4,887,142 | * 12/1989 | Bertotti et al. | 357/43 |
| 4,967,246 | * 10/1990 | Tanaka | 357/23.4 |
| 5,072,267 | * 12/1991 | Hattori | 357/23.4 |
| 5,237,186 | * 8/1993 | Nakagawa et al. | 257/212 |
| 5,541,132 | * 7/1996 | Davies et al. | 437/45 |
| 5,633,525 | * 5/1997 | Kitamura et al. | 257/381 |
| 5,949,104 | * 9/1999 | D'Anna et al. | 257/335 |
| 5,981,997 | * 11/1999 | Kitamura | 257/335 |
| 6,048,772 | * 4/2000 | D'Anna | 438/301 |

* cited by examiner

Primary Examiner—Minh Loan Tran
(74) Attorney, Agent, or Firm—Adams & Wilks (57) ABSTRACT

To provide a lateral double diffusion insulated gate field effect transistor with high driving current and low source-drain withstand voltage without receiving the influence of process fluctuation. Without shortening a gate electrode 10 as compared with conventional one, an impurity of the same conductivity type as a drain is ion-implanted from the side of a high concentration drain region 20 by using the gate electrode as a mask in a self-aligning manner. The amount of impurity implantation is set as higher than the concentration of a semiconductor substrate 19.

14 Claims, 5 Drawing Sheets

P-type low concentration impurity B 2.0E13/cm$^2$
N-type low concentration impurity B 3.0E13/cm$^2$
body thermal diffusion   1100°C   100 分
thickness of oxide film   1000 Å
gate electrode length 1.8   $\mu$ m
drain voltage 0.1V

SEMICONDUCTOR INTEGRATED CIRCUIT DEVICE HAVING DOUBLE DIFFUSION INSULATED GATE FIELD EFFECT TRANSISTOR

BACKGROUND OF THE INVENTION

The present invention relates to a lateral double diffusion insulated gate field effect transistor (hereinafter referred to as LDMOS) and a semiconductor integrated circuit device including the LDMOS.

In a semiconductor integrated circuit including mixed Bipolar-CMOS-DMOS Circuitry (hereinafter referred to as BiCDMOS), the DMOS Circuitry is mainly used for an output driver circuit where a large current on an ampere level flows. That is, with respect to the characteristics of the DMOS, higher driving performance is required as compared with other elements. When a complementary inverter is especially used as an output circuit, DMOS transistors having two different conductivity types including an N-channel and P-channel type and a having high driving performance are required. Integration of two DMOS transistors of different conductivity types on the same semiconductor substrate is generally realized by adopting a device separation process with a pn junction using an epitaxial layer.

Figure 2:
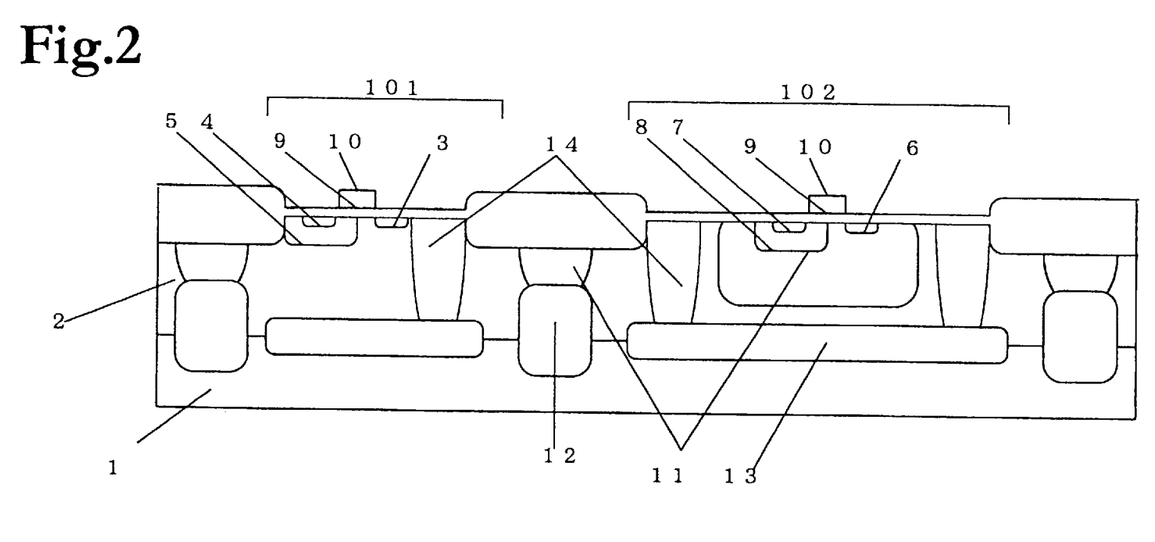
FIG. 2 is a schematic sectional view of a semiconductor integrated circuit using a conventional LDMOS.

FIG. 2 is a schematic sectional view of a conventional example in which an N-channel LDMOS and a P-channel LDMOS are formed on the same substrate at the same time.

As shown in the drawing, an N-type epitaxial layer 2 is generally formed on a P-type semiconductor substrate 1, and an element is formed in the N-type epitaxial layer 2. Reference numeral 101 denotes an N-channel LDMOS transistor. A P-type low concentration diffusion region 5 is formed by thermal diffusion in a region including an N-type source region 4, and is used as a body region of the LDMOS, so that the MOS transistor having a channel length consisting of a difference in the diffusion amount between the source region 4 below the gate electrode 10 and the P-type low concentration 5 region in a lateral direction is obtained. The outer circumference of the N-channel LDMOS is surrounded by a P-type well layer 11 and a P-type buried layer 12 as separation layers. In this case, the P-type well layer 11 is diffused to such a depth that it reaches the P-type buried layer 12.

Reference numeral 102 denotes a P-channel LDMOS transistor. A P-type well layer 11 is formed, and an element is formed therein. In this case, contrary to the N-channel LDMOS, an N-type low concentration diffusion region 8 is formed by thermal diffusion in a region including a P-type source region 7, and is used as a body region of the LDMOS. Thus, there is formed a MOS transistor having a channel length consisting of a difference in the amount of diffusion between the source region 7 below a gate electrode 10 and the N-type low concentration region 8 in the lateral direction. In case of the P-channel LDMOS, though it depends on a process condition or a desired performance of an element, in order to prevent a decrease in a withstand voltage in the vertical direction and the lateral direction and to prevent a leakage caused by a parasitic element, the circumference and the bottom of the element are surrounded, in this case, by an N-type sinker 14 and an N-type buried layer 13.

Figure 3:
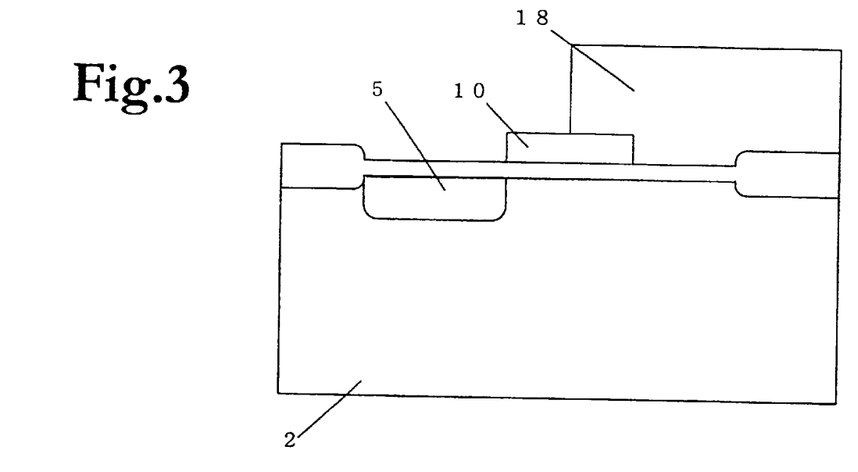
FIG. 3 is a schematic sectional view of one step in manufacture of an LDMOS.

The gate electrode 10 is made of polycrystal silicon in any of the foregoing elements, and impurity implantation of the low concentration diffusion region for forming the source region and the body region is carried out by an ion implantation method using the gate electrode as a mask and in a self-aligning manner as shown in FIG. 3. In this process, a photoresist mask layer 18 is used to cover a portion including half of the gate electrode for the purpose of masking the substrate so that an impurity is not implanted in the drain region. That is, in order to prevent the end of the photoresist on the gate electrode from overlapping with any of the source and drain regions, it is preferably set so that the length from the source region end of the gate electrode to the end of the drain is sufficiently large, and the end of the photoresist is positioned at the center thereof. When the process fluctuation of the photoresist and the gate electrode upon patterning is taken into consideration, the minimum value of the length of the gate electrode is around 1.8 $\mu$m.

With respect to the drain region, especially in the case where the source-drain withstand voltage is as low as 15 V or less, the drain region is also formed together with the source region in a self-aligning manner using the gate electrode as a mask. By the foregoing steps, in the N-channel LDMOS, a portion below a gate oxide film is formed of two regions consisting of the body region in which the channel is formed and an epitaxial region that becomes a low concentration drain region. A high concentration source region and a high concentration drain region are arranged on the body region side and the epitaxial region side at left and right with the gate electrode as the center, respectively. In case of the P-channel LDMOS, the foregoing region that becomes the low concentration drain region becomes the P-type well layer as shown in FIG. 2.

In the case where high driving performance is an object of the LBMOS transistor, it is desirable for the region that becomes the low concentration drain region below the gate electrode to be as short as the required source-drain withstand voltage can allow. This is because the portion becomes a drain parasitic resistance during transistor operation, and lowers a driving current under non-saturation conditions in the transistor operation. In order to shorten the region of the low concentration drain, it is preferable that the length between the source end of the gate electrode and the drain end is made short. However, when the length is made short, the source-drain withstand voltage is also lowered. Thus, it is necessary to set the length short within a range where a required withstand voltage is satisfied.

However, the conventional method has a problem to be solved as described below.

In a low withstand voltage LDMOS, for the purpose of increasing a driving current, when the length of the gate electrode is shortened to lower the drain parasitic resistance, even if there is allowance in the source-drain withstand voltage, the length can not be made 1.8 $\mu$m or less, as described above, due to the restriction caused by process fluctuation during the masking step of forming the body of the LDMOS.

Therefore, in order to solve such a problem inherent in the prior art, an object of the present invention is to increase a driving current without being influenced by process fluctuation at the time of a masking step of forming a body of an LDMOS.

SUMMARY OF THE INVENTION

In order to solve the foregoing problem, according to the present invention, there is provided a double diffusion insulated gate field effect transistor, characterized by comprising: a semiconductor substrate of a first conductivity type; a source region and a drain region of the first conductivity type, having each a high impurity concentration, formed in the semiconductor substrate of the first conductivity type, the source and drain regions being separated from each other by a channel having a distance; a given body region or first impurity regiven of a second conductivity type formed in a region surrounding the high impurity concentration source region, and including the high concentration source region; a diffusion region or second impurity region of the first conductivity type formed in a region surrounding the high impurity concentration drain region, and including the high concentration drain region; and a gate electrode formed on the semiconductor substrate of the first conductivity type between the high concentration source and drain regions, the body region of the second conductivity type, and the diffusion region of the first conductivity type through a gate insulating film.

Further, there is provided a semiconductor integrated circuit device, comprising: a first double diffusion insulated gate field effect transistor including: a semiconductor substrate of a first conductivity type; an epitaxial layer of a second conductivity type formed on the semiconductor substrate of the first conductivity type; a source region and a drain region of the second conductivity type, each having a high impurity concentration, formed in the epitaxial layer of the second conductivity type, the source and drain regions being separated from each other by a channel having a distance; a given body region of the first conductivity type formed in the epitaxial region and in a region surrounding the high impurity concentration source region, and including the high impurity concentration source region; and a diffusion region of the second conductivity type formed in a region surrounding the high impurity concentration drain region, and including the high impurity concentration drain region; and a second double diffusion insulated gate field effect transistor including: in the epitaxial layer of the second conductivity type formed on the semiconductor substrate of the first conductivity type, a well layer of the first conductivity type formed from a main surface of the epitaxial layer of the second conductivity type; a source region and a drain region of the first conductivity type, each having a high impurity concentration, formed in the well layer, the source and drain regions being separated from each other with a distance; a body region of the second conductivity type formed in the well region and in a region surrounding the high impurity concentration source region, and including the high impurity concentration source region; and a diffusion region of the first conductivity type formed in the well layer and in a region impurity surrounding the high concentration drain region, and including the high concentration drain region.

Further, in the foregoing structure, the semiconductor integrated circuit device is characterized in that the body region of the first conductivity type and the diffusion region of the first conductivity type have the same impurity concentration and the same region depth from the main surface, and at the same time, the body region of the second conductivity type and the diffusion region of the second conductivity type have the same impurity concentration and the same region depth from the main surface.

Further, in the foregoing structure, the semiconductor integrated circuit device is made such that the length of the gate electrode of the double diffusion insulated gate field effect transistor is 1.6 µm to 2 µm.

DETAILED DESCRIPTION

Hereinafter, embodiments of the present invention will be described with reference to the accompanying drawings.

Figure 1:
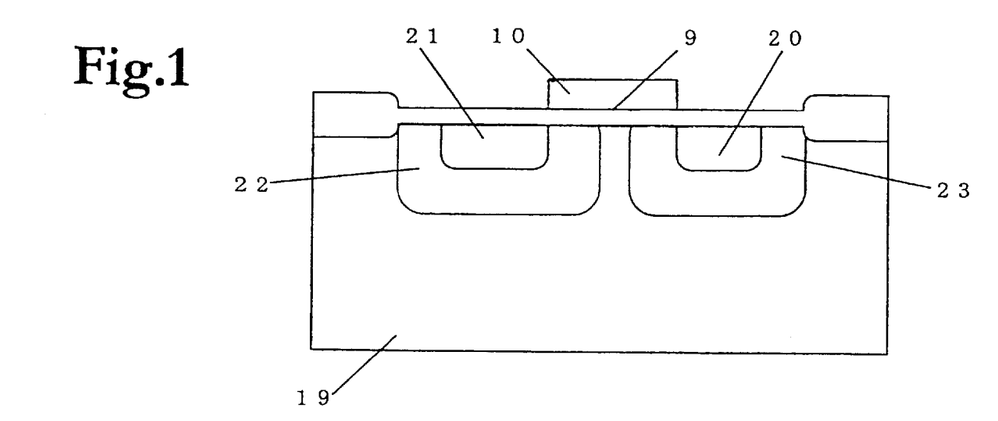
FIG. 1 is a schematic sectional view of an LDMOS of the present invention.

FIG. 1 is a sectional view of an LDMOS of the present invention. In the present invention, the length of a gate electrode 10 is not shortened as compared with conventional one, but an impurity 23 of the same conductivity type as a drain 20 is ion implanted from a drain region side by using a gate electrode 10 as a mask in a self-aligning manner. The amount of implanted impurity is set higher than the concentration of a semiconductor substrate 19. By this, parasitic resistance due to a low concentration drain can be made lower than the prior art, and driving performance can be made high.

Since the impurity implanted from the drain side is formed in a self-aligning manner with the gate electrode as the mask, there is no influence due to a mask shift, and an LDMOS with stable characteristics can be obtained. Further, since the length of the gate electrode 10 is the same as that of the prior art, there is no adverse influence caused by photo process fluctuation while forming a body region as described alone in connection with the prior art. Since the impurity concentration at the drain side is increased by this method, it is necessary to consider the fact that the source-drain withstand voltage is lowered. When the present invention is applied to the case where even if there is an allowance in the withstand voltage, the length of the gate electrode can not be shortened because of the restriction of process fluctuation, the amount of implanted impurity and the like can be determined purely by the balance of the withstand voltage and driving current, and high performance where electric characteristics are pursued to the utmost degree can be realized. This method can be applied to both N-channel and P-channel LDMOSs. As the amount of implanted ion for the low concentration diffusion region 23, it is appropriate to set it within the range of $1\times10^{13}/cm^2$ to $1\times10^{15}/cm^2$.

Figure 4:
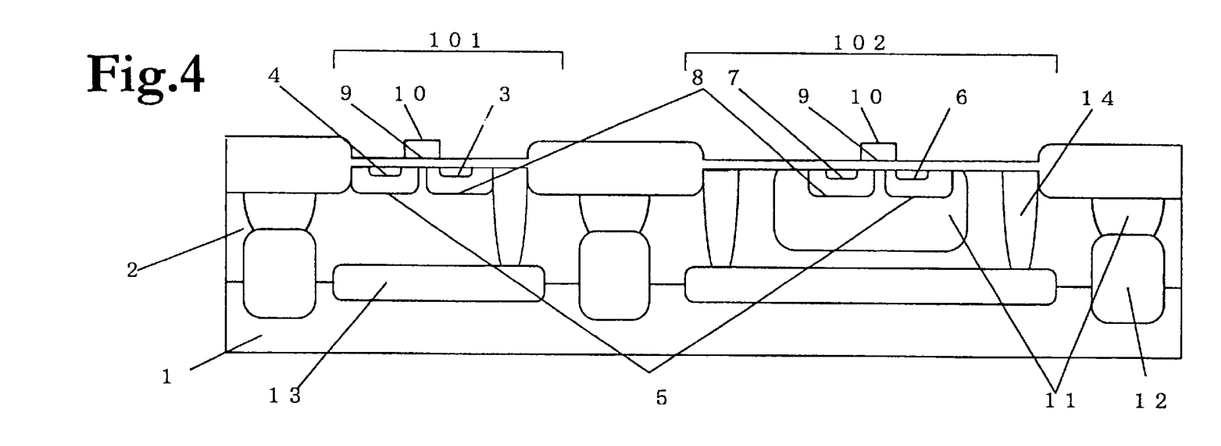
FIG. 4 is a schematic sectional view of a semiconductor integrated circuit using an LDMOS of the present invention.

FIG. 4 is a schematic sectional view showing a case where N-channel and P-channel LDMOSs formed through manufacturing step of a BiCD process are integrated at the same time. In case of such concurrent integration of the LDMOSs of both conductivity types, with respect to an impurity in the present invention implanted from the high concentration drain region at the formation of the LDMOS of one conductivity type, a low concentration impurity used in the body region of the other conductivity type can be used at the same time. For example, in case of the N-channel LDMOS, an N-type low concentration impurity used in the body region of the P-channel LDMOS is used from the side of the high concentration drain region together with impurity implantation of the body region of the P-channel LDMOS, and in case of the P-channel LDMOS, a P-type low concentration impurity used in the body region of the N-channel LDMOS is used from the side of the high concentration drain region together with imparity implantation of the body region of the N-channel LDMOS. By this, since there is no addition of a masking step as compared with the prior art, there is an advantage in that an improvement of only electric characteristics can be purely obtained.

In a manufacturing process at that case, only steps peculiar to the present invention will be specifically described by use of FIGS. 5(a) to (d).

Figure 5A:
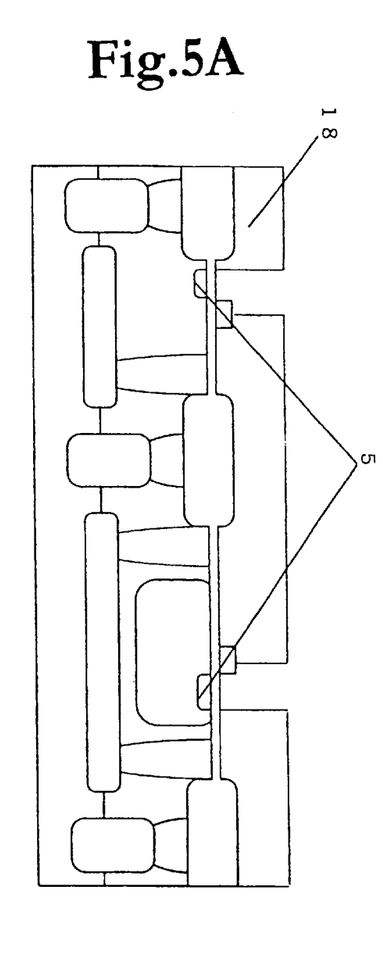
FIGS. 5A–5D are a sectional view showing part of steps of a manufacturing method of a semiconductor integrated circuit using an LDMOS of the present invention.
Figure 5B:
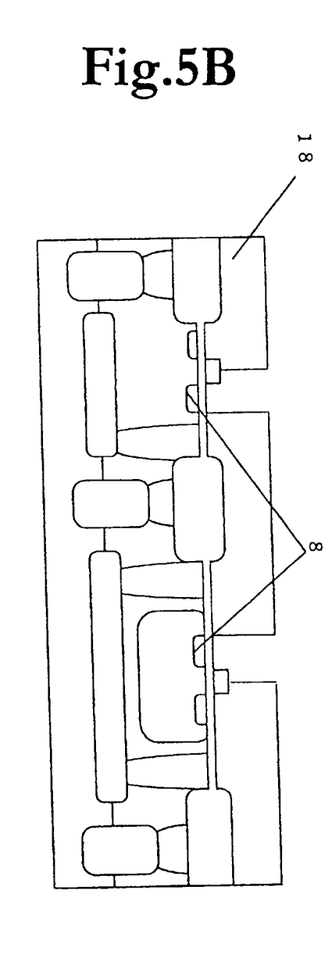
Figure 5C:
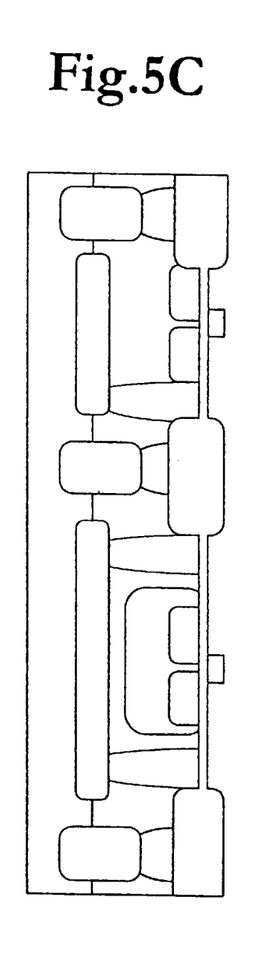
Figure 5D:
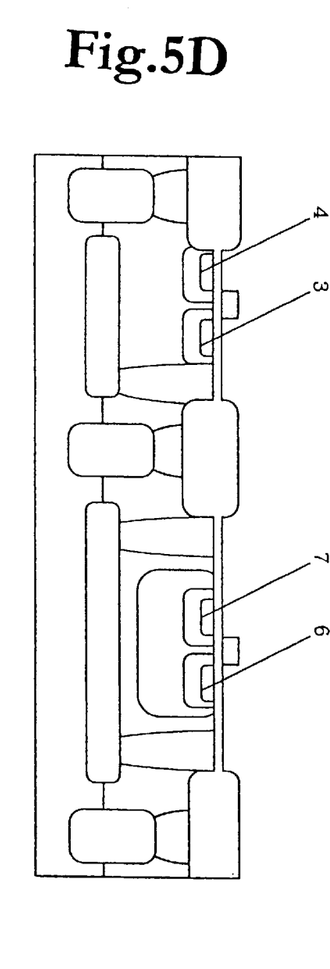

First, in a step of body formation of an N-channel LDMOS shown in FIG. 5(a), boron as a P-type low concentration impurity is implanted from a source region by an ion implantation method and by using one masking step. At this time, the impurity is implanted also in a drain region of a P-channel LDMOS. Next, as shown in FIG. 5(b), for the purpose of forming a body region of the P-channel LDMOS, phosphorus as an N-type low concentration impurity is implanted in a source region of the P-channel LDMOS and a drain region of the N-channel LDMOS. Next, as shown in FIG. 5(c), the implanted impurity is diffused by thermal diffusion. Then, as shown in FIG. 5(d), two masking steps are used in a normal method, so that high concentration impurities are implanted in the source and the drain regions. By the foregoing method, the concentration of the low concentration drain region can be increased without increasing its steps.

Figure 6:
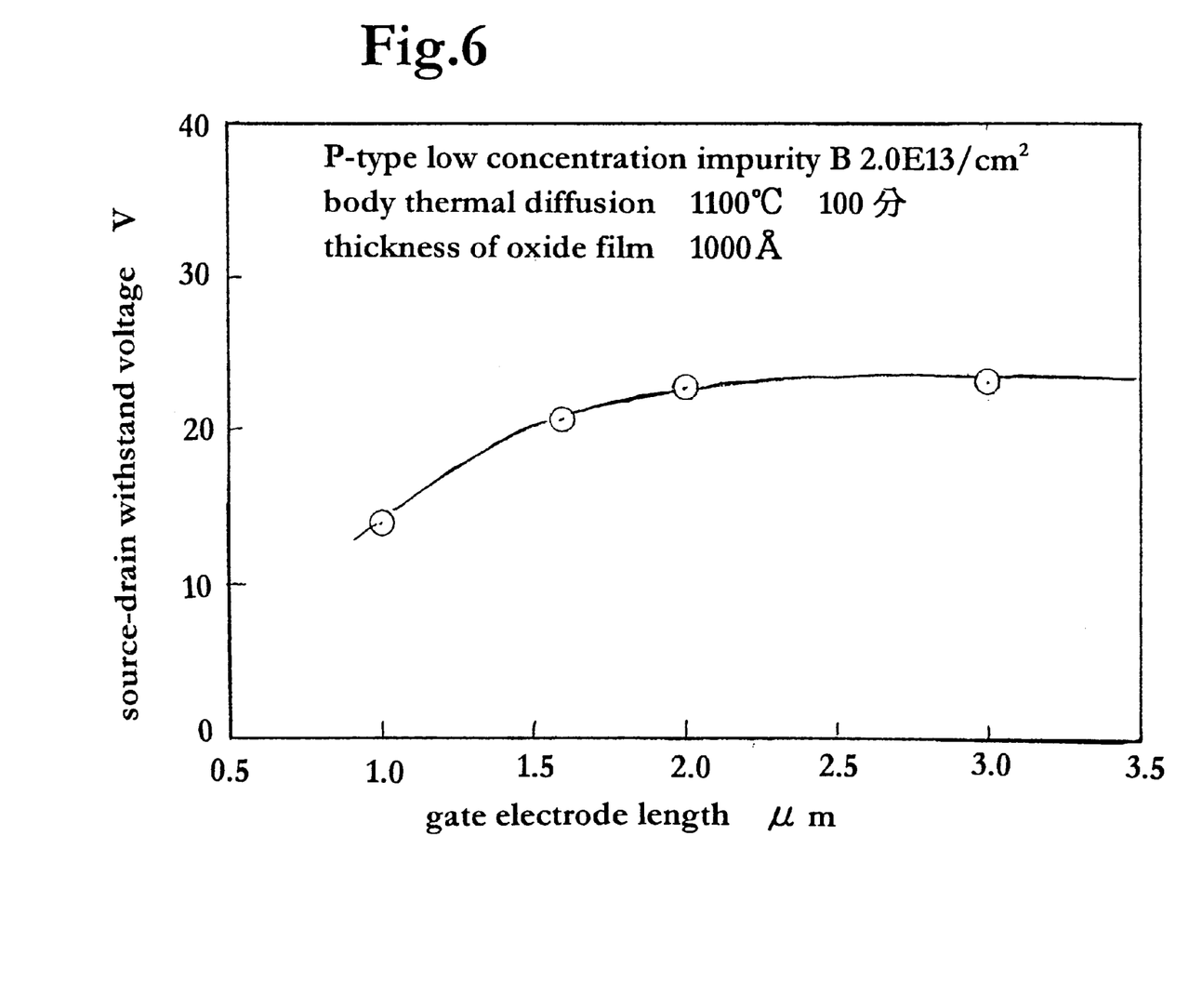
FIG. 6 is a graph showing the relation between a gate electrode length and a source-drain withstand voltage in a conventional N-channel LDMOS.

Next, an example of actual characteristics will be described. FIG. 6 shows a dependency of source-drain withstand voltage of a conventional N-channel LDMOS to the length of a gate electrode. In the case where the specification of the withstand voltage is made 15 V, the length of the gate electrode can be shortened down to about 1.0 $\mu$m. However, when the fluctuation of the photo process at the formation of the body region described before is taken into consideration, a length of 1.6 $\mu$m to 2.0 $\mu$m, 1.8 $\mu$m on average, is required for the length of the gate electrode. When this size is adopted, there is a sufficient allowance for withstand voltage specification. Here, the length of the gate electrode is made 1.8 $\mu$m and the present invention is adopted using process conditions of FIG. 7, and an N-type low concentration impurity is implanted from the drain region. In this case, too, a source-drain withstand voltage of 15 V or more can be obtained.

Figure 7:
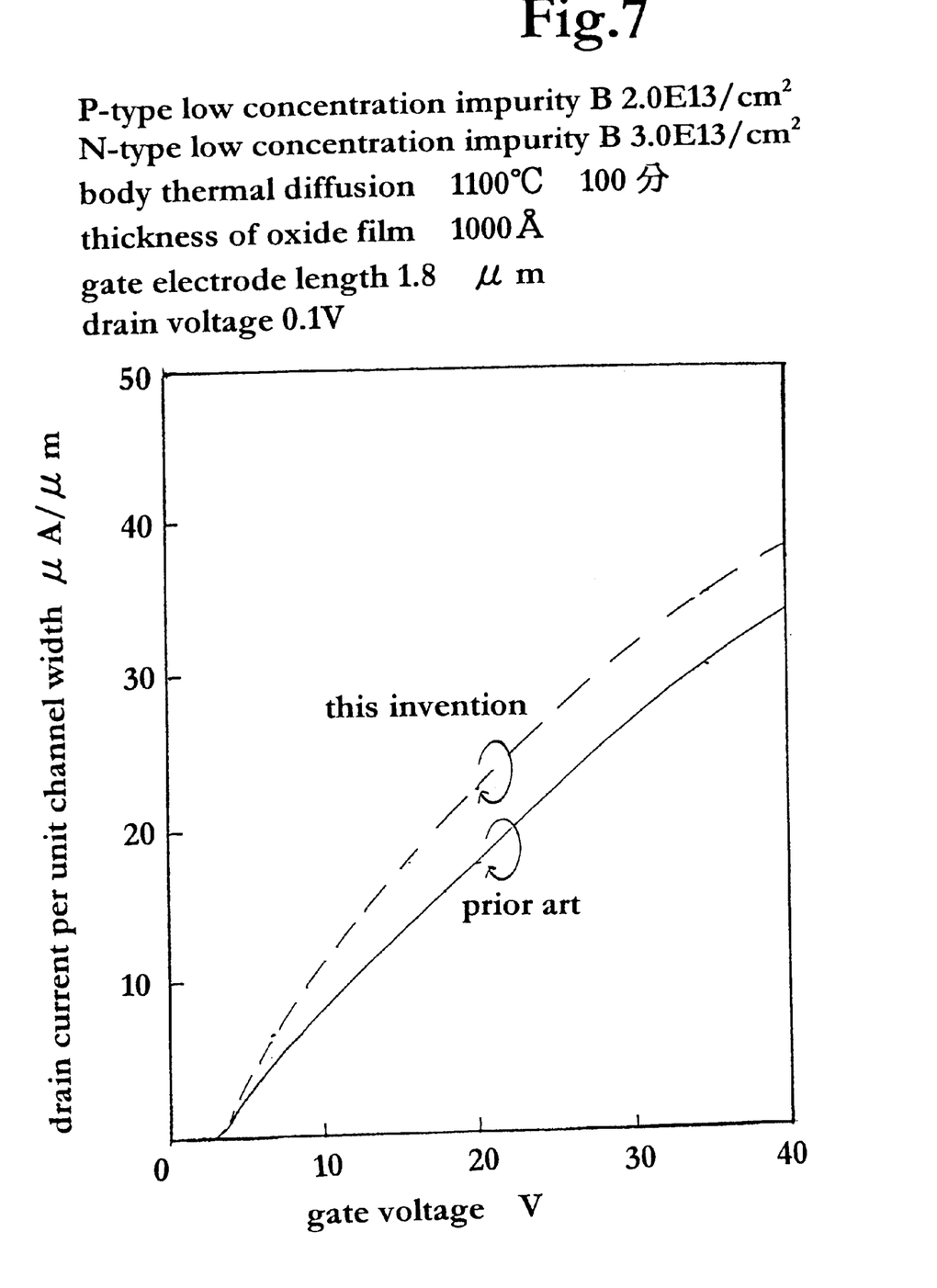
FIG. 7 is a graph showing the relations between a gate voltage and a drain current per unit channel width in N-channel LDMOSs of the prior art and the present invention.

FIG. 7 is a characteristic graph in which the relation of drain current to gate voltage in the case of a gate electrode length of 1.8 $\mu$m is compared between a case of the prior art and a case of the present invention. As is understood from this characteristic, in the present invention, while the withstand voltage specification can be satisfied, the driving performance can be increased by about 20%. Similarly, also in the P-channel LDMOS, while satisfying the withstand voltage specification in the process condition of FIG. 7, it is possible to increase the driving performance by about 20%.

The process condition of FIG. 7 is a condition for a case where LDMOSs of two different conductivity types are integrated on one semiconductor substrate at the same time. Thus, it is understood that under this condition, the foregoing characteristic can be obtained without increasing its steps as compared with the prior art.

According to the present invention, in an LDMOS of low withstand voltage, without receiving the influence of process fluctuation, it is possible to realize the increase of driving capacity stably.

What is claimed is:
1. A semiconductor integrated circuit device, comprising:
a first double diffusion insulated gate field effect transistor comprising a semiconductor substrate of a first conductivity type; an epitaxial layer of a second conductivity type formed on the semiconductor substrate of the first conductivity type; a source region and a drain region of the second conductivity type, each having a high impurity concentration, formed on the epitaxial layer of the second conductivity type, the source and drain regions being separated from each other by a given distance; a body region of the first conductivity type formed in the epitaxial layer in a region surrounding the high impurity concentration source region, and including the high impurity concentration source region; and a diffusion region of the second conductivity type formed in a region of the epitaxial layer surrounding the high impurity concentration drain region, and including the high impurity concentration drain region; and
a second double diffusion insulated gate field effect transistor comprising in the epitaxial layer of the second conductivity type formed on the semiconductor substrate of the first conductivity type, an impurity well region of the first conductivity type formed in a main surface of the epitaxial layer of the second conductivity type; a source region and a drain region of the first conductivity type, each having a high impurity concentration, formed in the well region, the source and drain regions being separated from each other by a given distance; a body region of the second conductivity type formed in the well region and in a region surrounding the high impurity concentration source region, and including the high concentration source region; and a diffusion region of the first conductivity type formed in the well region and in a region surrounding the high impurity concentration drain region, and including the high impurity concentration drain region.

2. A semiconductor integrated circuit device as claimed in claim 1; wherein the body region of the first conductivity type and the diffusion region of the first conductivity type each have the same impurity concentration and the same region depth from the main surface, and the body region of the second conductivity type and the diffusion region of the second conductivity type each have the same impurity concentration and the same region depth from the main surface.

3. A semiconductor integrated circuit device as claimed in claim 2; wherein the first and second double diffusion insulated gate field effect transistors further comprise a gate electrode formed on the semiconductor substrate through a gate insulation film between the high impurity concentration source and drain regions, and above the body region and the diffusion region, and a length of the gate electrode in a direction from the source region to the drain region is in the range of about 1.6 $\mu$m to 2 $\mu$m.

4. A double diffusion insulated gate field effect transistor comprising: a semiconductor substrate; a source region formed in the semiconductor substrate; a drain region formed in the semiconductor substrate; a first impurity region formed in the semiconductor substrate and surrounding the source region; a second impurity region formed in the semiconductor substrate and surrounding the drain region; a gate electrode formed on the semiconductor substrate between the source and drain regions, and above the first and second impurity regions; and a gate insulation film formed between the semiconductor substrate and the gate electrode; wherein the first impurity region has a lower impurity concentration than the source region and the second impurity region has a lower impurity concentration than the drain region; and wherein the semiconductor substrate, the source region, the drain region and the second impurity region have a first conductivity type and the first impurity region has a second conductivity type.

5. A double diffusion insulated gate field effect transistor according to claim 4; wherein the semiconductor substrate comprises a supporting substrate and an epitaxial layer disposed thereon, and the source region, the drain region, and the first and second impurity regions are formed in the epitaxial layer.

6. A double diffusion insulated gate field effect transistor according to claim 4; wherein a length of the gate electrode in a direction from the source region to the drain region is in the range of about 1.6 $\mu$m to 2 $\mu$m.

7. A double diffusion insulated gate field effect transistor according to claim 4; further comprising a second transistor formed in the semiconductor substrate.

8. A semiconductor integrated circuit device comprising: a first transistor comprising a semiconductor substrate; a source region formed in the semiconductor substrate; a drain region formed in the semiconductor substrate; a first impurity region formed in the semiconductor substrate and surrounding the source region; a second impurity region formed in the semiconductor substrate and surrounding the drain region; a gate electrode formed on the semiconductor substrate between the source and drain regions, and above the first and second impurity regions; and a gate insulation film formed between the semiconductor substrate and the gate electrode; and a second transistor formed in the semiconductor substrate, the second transistor comprising an impurity well formed in the semiconductor substrate; a second source region formed in the impurity well; a second drain region formed in the impurity well; a third impurity region formed in the impurity well to surround the second source region, and having a lower impurity concentration than the second source region; a fourth impurity region formed in the impurity well to surround the second drain region, and having a lower impurity concentration than the second drain region; a second gate electrode formed on the semiconductor substrate between the second source and drain regions; and a gate insulation film formed between the semiconductor substrate and the second gate electrode.

9. A semiconductor integrated circuit according to claim 8; wherein the third impurity region has a lower impurity concentration than the second source region and the fourth impurity region has a lower impurity concentration than the second drain region.

10. A semiconductor integrated circuit according to claim 9; wherein the semiconductor substrate, the source region, the drain region and the second impurity region have a first conductivity type, the first impurity region has a second conductivity type, and the second source region, the second drain region and the fourth impurity region have the second conductivity type, and the third impurity region has the first conductivity type.

11. A semiconductor integrated circuit according to claim 8; wherein the semiconductor substrate, the source region, the drain region and the second impurity region have a first conductivity type, the first impurity region has a second conductivity type, and the second source region, the second drain region and the fourth impurity region of have the second conductivity type, and the third impurity region has the first conductivity type.

12. A semiconductor integrated circuit according to claim 8; wherein the semiconductor substrate comprises a supporting substrate and an epitaxial layer disposed thereon, and the source regions, the drain regions, the impurity well and the first through fourth impurity regions are formed in the epitaxial layer.

13. A semiconductor integrated circuit according to claim 8; wherein a length of the second gate electrode in a direction from the second source region to the second drain region is in the range of about 1.6 $\mu$m to 2 $\mu$m.

14. A semiconductor integrated circuit according to claim 8; wherein the first impurity region and the fourth impurity region each have the same impurity concentration and the same region depth from a main surface of the semiconductor substrate, and the third impurity region and the second impurity region each have the same impurity concentration and the same region depth from the main surface.

* * * * *

UNITED STATES PATENT AND TRADEMARK OFFICE
CERTIFICATE OF CORRECTION

PATENT NO.   : 6,236,084 B1
DATED        : May 22, 2001
INVENTOR(S)  : Hirofumi Harada, et al.

Page 1 of 1

It is certified that error appears in the above-identified patent and that said Letters Patent is hereby corrected as shown below:

<u>Title page,</u>
Item [30] under Foreign Application Priority Data should read -- Jan. 6, 1998 [JP] ................... 10 - 151743 --.

Signed and Sealed this

Eighteenth Day of September, 2001

Attest:

*Nicholas P. Godici*

NICHOLAS P. GODICI
*Attesting Officer*   *Acting Director of the United States Patent and Trademark Office*